United States Patent
Endo et al.

(10) Patent No.: US 10,178,809 B2
(45) Date of Patent: Jan. 8, 2019

(54) MODULE-TYPE DATA CENTER

(71) Applicant: FUJITSU LIMTED, Kawasaki-shi, Kanagawa (JP)

(72) Inventors: Hiroshi Endo, Isehara (JP); Masao Kondo, Sagamihara (JP); Hiroyuki Fukuda, Ebina (JP); Masatoshi Ogawa, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 731 days.

(21) Appl. No.: 14/501,738

(22) Filed: Sep. 30, 2014

(65) Prior Publication Data

US 2015/0016056 A1 Jan. 15, 2015

Related U.S. Application Data

(63) Continuation of application No. PCT/JP2012/058921, filed on Apr. 2, 2012.

(51) Int. Cl.
*F24F 1/00* (2011.01)
*G06F 1/20* (2006.01)
(Continued)

(52) U.S. Cl.
CPC ......... *H05K 7/20836* (2013.01); *G06F 1/206* (2013.01); *H05K 7/1497* (2013.01);
(Continued)

(58) Field of Classification Search
CPC .......... H05K 7/20836; H05K 7/20745; H05K 7/20736; H05K 7/1497; G06F 1/206; F24F 200/0048
See application file for complete search history.

(56) References Cited

U.S. PATENT DOCUMENTS

2004/0217072 A1* 11/2004 Bash .................. H05K 7/20718
211/26
2007/0125107 A1* 6/2007 Beam ............................ 62/186
(Continued)

FOREIGN PATENT DOCUMENTS

JP   H11-204974      7/1999
JP   2003-46286 A1   2/2003
(Continued)

OTHER PUBLICATIONS

Search Report of corresponding European Patent Application No. 12873691.5 dated Nov. 18, 2015.
(Continued)

*Primary Examiner* — Charles E Anya
(74) *Attorney, Agent, or Firm* — Kratz, Quintos & Hanson, LLP

(57) ABSTRACT

A module-type data center includes: a casing having an intake vent and an exhaust vent; a rack accommodating an electronic device; an air blower configured to introduce outside air into the casing through the intake vent and pass air through the rack from one of surfaces of the rack to another one of the surfaces of the rack; a shielding-slat unit including a plurality of shielding slats configured to change between an open state and a closed state and drive devices configured to drive the corresponding shielding slats. An inner space of the casing is divided into a first space defined between the one surface of the rack and the intake vent, a second space defined between the other surface of the rack and the exhaust vent, and a third space defined above the rack and allowing the second space to communicate with the first space.

3 Claims, 9 Drawing Sheets

(51) Int. Cl.
H05K 7/14 (2006.01)
H05K 7/20 (2006.01)
(52) U.S. Cl.
CPC ..... *H05K 7/20736* (2013.01); *H05K 7/20745* (2013.01); *F24F 2001/0048* (2013.01); *Y02D 10/16* (2018.01)

(56) References Cited

U.S. PATENT DOCUMENTS

| | | | | |
|---|---|---|---|---|
| 2009/0231809 | A1* | 9/2009 | Koide | G06F 1/203 361/697 |
| 2010/0114356 | A1 | 5/2010 | Schmitt et al. | |
| 2011/0128699 | A1* | 6/2011 | Heydari | H05K 7/20836 361/679.48 |
| 2011/0151765 | A1* | 6/2011 | Chen | H05K 7/20745 454/184 |
| 2011/0306288 | A1* | 12/2011 | Murayama | F24F 11/0001 454/184 |
| 2012/0016526 | A1* | 1/2012 | Burton | G05D 23/1931 700/278 |
| 2012/0136488 | A1* | 5/2012 | Tan | G05D 23/1934 700/278 |
| 2017/0027086 | A1* | 1/2017 | Noteboom | F24F 11/0001 |

FOREIGN PATENT DOCUMENTS

| | | | |
|---|---|---|---|
| JP | 2007-293936 A1 | 11/2007 | |
| JP | 2009140421 A * | 6/2009 | ............... G06F 1/20 |
| JP | 2009-216295 A1 | 9/2009 | |
| JP | 2009257730 A * | 11/2009 | |
| JP | 2012-18584 A1 | 1/2012 | |
| WO | 20100123661 A2 | 10/2010 | |
| WO | 20110148175 A2 | 12/2011 | |

OTHER PUBLICATIONS

European Patent Application No. 12873691.5: Communication pursuant to Article 94(3) EPC dated Apr. 20, 2017.
Office Action of Japanese Patent Application No. 2014-508931 dated Aug. 11, 2015; partial translation of the Office Action.
Chinese Patent Application No. 201280072093.8: Notification of the First Office Action dated Mar. 1, 2017.
International Search Report for International Application No. PCT/JP2012/058921 dated May 1, 2012.

* cited by examiner

MODULE-TYPE DATA CENTER

CROSS-REFERENCE TO RELATED APPLICATION

This application is a continuation of International Patent Application No. PCT/JP2012/058921 filed, Apr. 2, 2012 and designated the U.S., the entire contents of which are incorporated herein by reference.

FIELD

The embodiments discussed herein relate to a module-type data center.

BACKGROUND

The arrival of an advanced information society in recent years has desired computers to handle a large amount of data and has increasingly raised the importance and necessity of a data center that collectively manages a large number of computers.

A typical data center has a building constructed on a vast land, large-scale air-conditioning equipment, and large-scale electrical equipment. Hence, it takes a long time to complete a data center, and it is therefore difficult to speedily respond to the rise and fall of demand.

Against such a background, a module-type data center has been developed and put into practice. In a module-type data center, racks accommodating servers and the like, air-conditioning equipment, and electrical equipment are placed in a construction, called a container, of a predetermined size. Many types of module-type data centers take outside air into the container and cool the heat produced by the servers with the outside air, to thereby achieve reduction in the power used to cool the servers.

Patent Document 1: Japanese Laid-open Patent Publication No. 11-204974
Patent Document 2: Japanese Laid-open Patent Publication No. 2007-293936

SUMMARY

One aspect of the disclosed technique provides a module-type data center that includes: a casing having an intake vent on one of surfaces thereof and an exhaust vent on another one of the surfaces thereof; a rack placed inside the casing and accommodating an electronic device; an air blower configured to introduce outside air into the casing through the intake vent and pass air through the rack from one of surfaces of the rack to another one of the surfaces of the rack; a shielding-slat unit including a plurality of shielding slats configured to change between an open state and a closed state and drive devices configured to drive the corresponding shielding slats, the shielding-slat unit being configured to change an aperture ratio of the exhaust vent; and a controller configured to control the drive devices of the shielding-slat unit. An inner space of the casing is divided into a first space defined between the one surface of the rack and the intake vent, a second space defined between the other surface of the rack and the exhaust vent, and a third space defined above the rack and allowing the second space to communicate with the first space.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Before describing embodiments, a prelude is given to facilitate understanding of the embodiments.

As described earlier, many module-type data centers cool the servers with outside air. In some cases, the temperature of the outside air falls below an installation lower-limit temperature at which normal operation of the servers is guaranteed. In such a case where the outside air has a low temperature, part of warm air exhausted from the servers is brought back to the intake side and mixed with the outside air so that the temperature of the air to be supplied to the servers may be higher than or equal to the installation lower-limit temperature.

Figure 1:
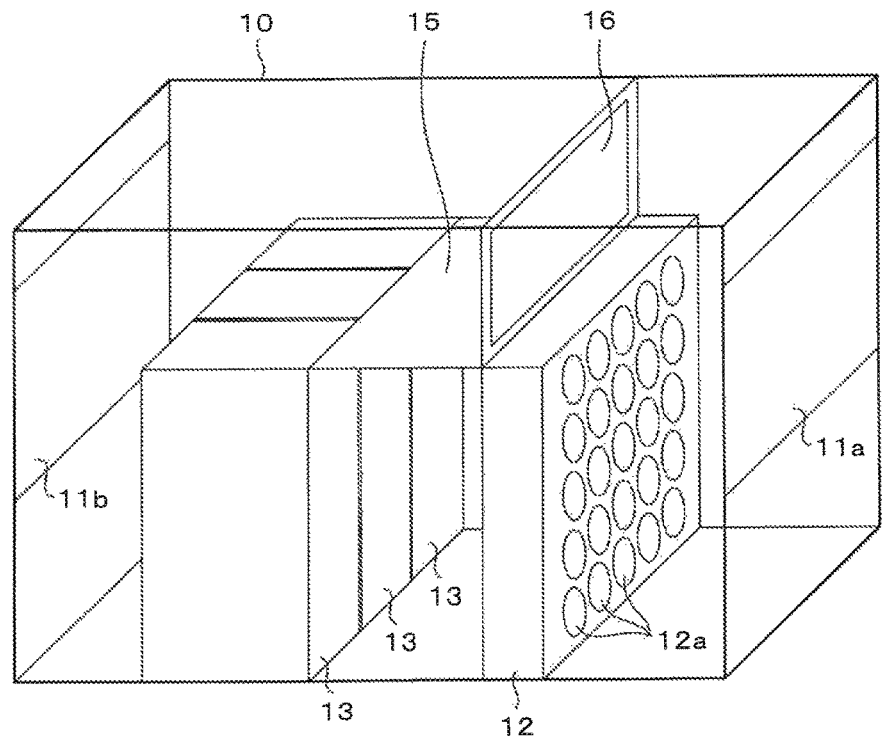
FIG. 1 is a schematic perspective view illustrating an example of a module-type data center.
Figure 2:
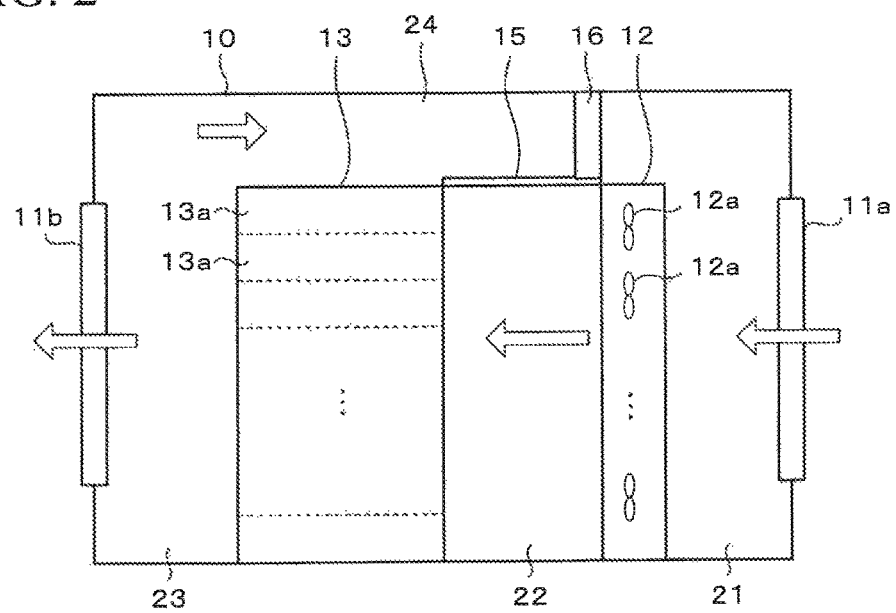
FIG. 2 is a schematic side view of the same.

FIG. 1 is a schematic perspective view illustrating an example of a module-type data center, and FIG. 2 is a schematic side view of the same. The module-type data center illustrated in FIGS. 1 and 2 has a cuboid container 10, a fan unit 12 placed inside the container 10, and a plurality of racks 13. An intake vent 11a is provided on one of two opposite surfaces of the container 10, and an exhaust vent 11b is provided on the other surface thereof. Additionally, a partitioning plate 15 is placed above a space between the fan unit 12 and the racks 13.

Each rack 13 accommodates electronic devices such as a server, a storage device, or a power source. The fan unit 12 is provided with a plurality of fans 12a. The intake vent 11a and the exhaust vent 11b are each provided with a rainwater-ingress prevention plate for preventing ingress of rainwater and an insect screen for preventing ingress of insects and the like.

The fan unit 12, the racks 13, and the partitioning plate 15 divide the inner space of the container 10 into an outside-air introduction part 21, a cold aisle 22, a hot aisle 23, and a warm-air circulation path 24. The outside-air introduction part 21 is a space between the intake vent 11a and the fan unit 12, the cold aisle 22 is a space between the fan unit 12 and the racks 13, and the hot aisle 23 is a space between the racks 13 and the exhaust vent 11b.

The warm-air circulation path 24 is a space above the racks 13 and the partitioning plate 15, and allows the hot aisle 23 to communicate with the outside-air introduction part 21. The warm-air circulation path 24 is provided with a damper 16 configured to adjust the circulation amount of warm air.

In such a module-type data center, air (outside air) is introduced into the out-side air introduction part 21. through the intake vent 11a by the rotation of the fans 12a of the fan unit 12. The air introduced into the outside-air introduction part 21 moves through the fan unit 12 to the cold aisle 22, and enters the racks 13 through the front surface sides of the racks 13 to cool the servers. The air (warm air) increased in temperature by cooling the servers is exhausted through the back surfaces of the racks 13 to the not aisle 23, and is then exhausted to the outside of the container 10 through the exhaust vent 11b.

When the outside air has a high temperature, the damper 16 is closed so that the warm air will not move from the hot aisle 23 to the outside-air introduction part 21. On the other hand, when the outside air has a low temperature and the temperature of air introduced into the racks 13 might fall below the installation lower-limit temperature, the damper 16 is opened to bring part of the warm air in the hot aisle 23 back to the outside-air introduction part 21 along the warm-air circulation path 24.

In the module-type data center described above, however, even with the damper 16 open, a majority of the warm air exhausted from the racks 13 is exhausted to the outside of the container 10 through the exhaust vent 11b, and a little amount of warm air in the hot aisle 23 flows into the outside-air introduction part 21. For this reason, the warm air all exhausted from the racks 13 are used at a low efficiency, which makes the temperature of air introduced into the racks 13 fall below the installation lower-limit temperature when the outside air has a low temperature.

A conceivable way to avoid such a problem is to place an air-volume adjustment damper at the exhaust vent 11b, and adjust the circulation amount of the warm air by changing the angle of the fins of the air-volume adjustment damper. However, even in such a case, due to the high flow speed of the air exhausted from the racks 13, if the fins have certain gaps therebetween, a majority of the warm air is exhausted to the outside through those gaps between the fins. For this reason, it is difficult to precisely control the circulation amount of the warm air by uniformly adjusting the angles of the multiple fins of the damper.

The following embodiments describe module-type data centers each capable of precisely controlling the circulation amount of warm air exhausted from the racks.

Figure 3:
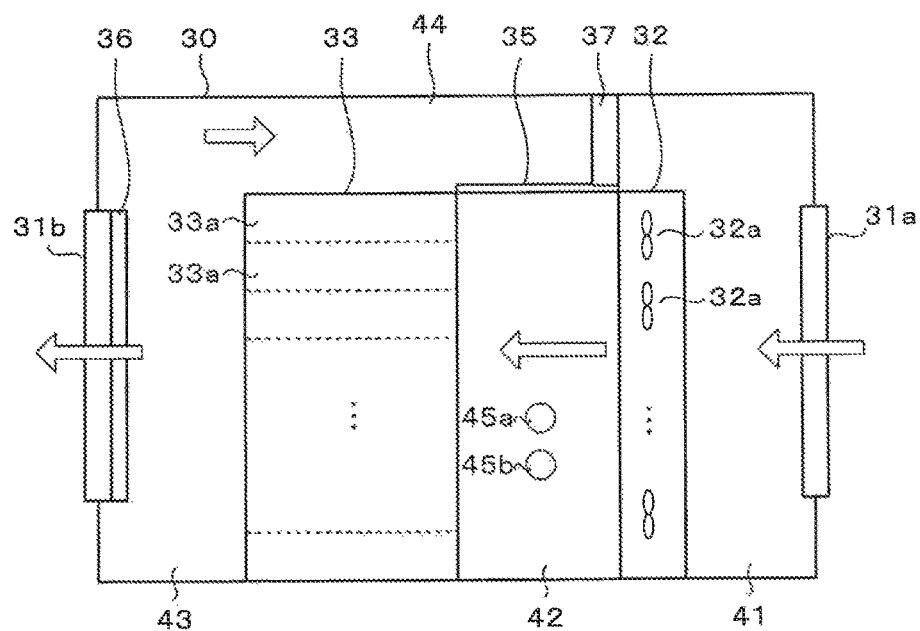
FIG. 3 is a schematic side view illustrating a module-type data center according to a first embodiment.

(First Embodiment) FIG. 3 is a schematic side view illustrating a module-type data center according to a first embodiment.

The module-type data center according to this embodiment has a cuboid container 30, a an unit 32 placed inside the container 30, and a plurality of racks 33 placed inside the container 30. An intake vent 31a is provided on one of two opposite surfaces of the container 30, and an exhaust vent 31b is provided on the other surface thereof. Additionally, a partitioning plate 35 is placed above a space between the fan unit 32 and the racks 33. Note that the container 30 is an example of a casing, and the fan unit 32 is an example of an air blower.

Each rack 33 accommodates electronic devices such as a server (computer) 33a, a storage device, or a power supply. The fan unit 32 is provided with a plurality of fans 32a. The intake vent 31a and the exhaust vent 31b are each, provided with a rainwater-ingress prevention plate for preventing ingress of rainwater and an insect screen for preventing ingress of insects and the like.

In this embodiment, a shielding-slat unit 36 is placed on the inner side or the outer side (the inner side in the example illustrated in FIG. 3) of the exhaust vent 31b. The shielding-slat unit 36 is configured to adjust the aperture ratio of the exhaust vent 31b. Details of the shielding-slat unit 36 will be given later.

The fan unit 32, the racks 33, and the partitioning plate 35 divide the inner space of the container 30 into an outside-air introduction part 41, a cold aisle 42, a hot aisle 43, and a warm-air circulation path 44. The outside-air introduction part 41 is a space between the intake vent 31a. and the fan unit 32, the cold aisle 42 is a space between the fan unit 32 and the racks 33, and the hot aisle 43 is a space between the racks 33 and the exhaust vent 31b. A temperature sensor 45a and a humidity sensor 45b are placed in the cold aisle 42 to measure the temperature and humidity inside the cold aisle 42.

The outside-air introduction part 41 and the cold aisle 42 are an example of a first space, the hot aisle 43 is an example of a second space, and the warm-air circulation path 44 is an example of a third space.

The warm-air circulation path 44 is provided above the racks 33 and the cold aisle 42, and is separated from the cold aisle 42 by the partitioning plate 35. The warm-air circulation path 44 is a space for bringing the warm air exhausted from the racks 33 to the hot aisle 43 back to the outside-air introduction part 41. The warm-air circulation path 44 is provided with a damper 37 configured to adjust the circulation amount of the warm air.

Although not illustrated in FIG. 3, a vaporization cooling apparatus is provided in the outside-air introduction part 41 to reduce the temperature of air introduced into the outside-air introduction part 41 by using evaporative latent heat of water when the outside air has a high temperature.

Figure 4:
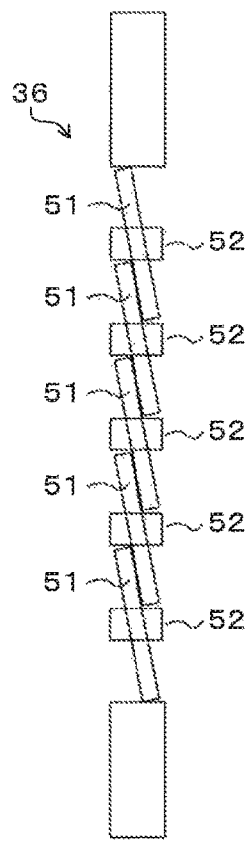
FIGS. 4A to 4C are schematic diagrams illustrating a shielding-slat unit.
Figure 4:
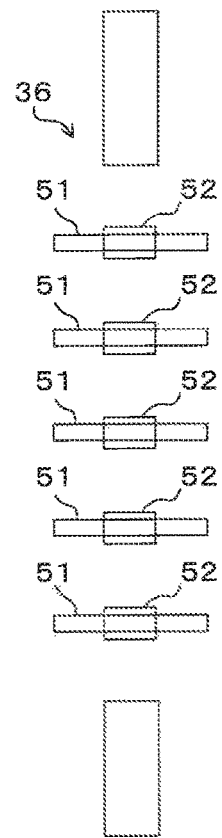
Figure 4:
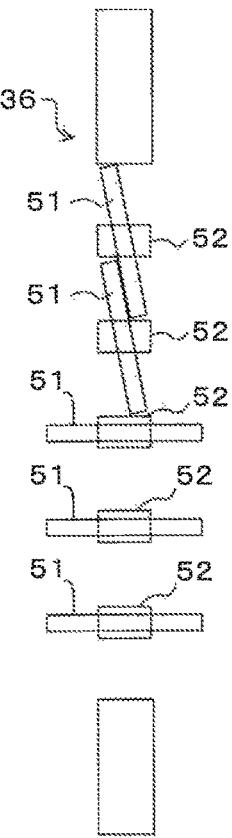
Figure 5:
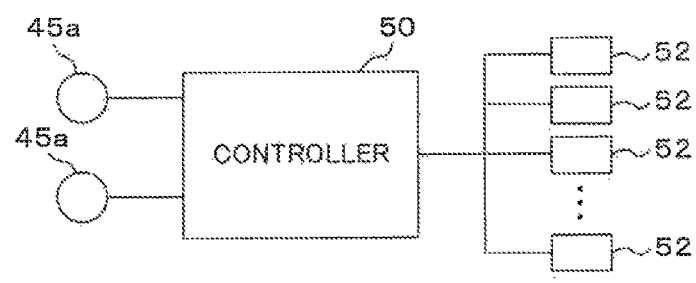
FIG. 5 is a block diagram illustrating how a temperature sensor, a humidity sensor, a controller, and drive devices are connected to one another.

FIGS. 4A to 4C are schematic diagrams illustrating the shielding-slat unit 36. As illustrated in FIGS. 4A to 4C, the shielding-slat unit 36 has: a plurality of shielding slats 51 arranged vertically and capable of being individually adjusted in angle; and drive devices 52 configured to drive the respective shielding slats 51. The drive devices 52 are, as illustrated in FIG. 5, connected to a controller 50. The controller 50 is configured to control the drive devices 52 individually based on signals outputted from the temperature sensor 45a and the humidity sensor 45b.

The aperture ratio of the exhaust vent 31b is 0% when all the shielding slats 51 are almost vertical as illustrated in FIG. 4A. When the damper 37 in the warm-air circulation path 44 is opened in this state, all the warm-air exhausted from the racks 33 to the hot aisle 43 is brought back to the outside-air introduction part 41, increasing the temperature of the air in the cold aisle 42. Hereinbelow, the shielding slats 51 that are almost vertical as illustrated in FIG. 4A are called closed shielding slats 51.

The aperture ratio of the exhaust vent 31b is 100% when all the shielding slats 51 are horizontal as illustrated in FIG. 4B. When the damper 37 in the warm-air circulation path 44 is closed in this state, all the warm-air in the hot aisle 43 is exhausted to the outside of the container 30. Hereinbelow, the shielding slats 51 that are so horizontal as illustrated in FIG. 4B are called open shielding slats 51.

When some of the shielding slats 51 are opened and the rest of the shielding slats 51 are closed as in FIG. 4C, the aperture ratio of the exhaust vent 31b varies according to the ratio between the number of the open shielding slats 51 and the number of the closed shielding slats 51. The higher the percentage of the number of the open shielding slats 51, the higher the aperture ratio of the exhaust vent 31b. Thus, less air is brought back from the hot aisle 43 to the outside-air introduction part 41.

The material of the shielding slats 51 is not particularly limited as long as they are strong enough not to be deformed by the pressure of air exhausted from the racks 33. The shielding slats 51 may be formed with, for example, plastic, metal, or the like.

Figure 6:
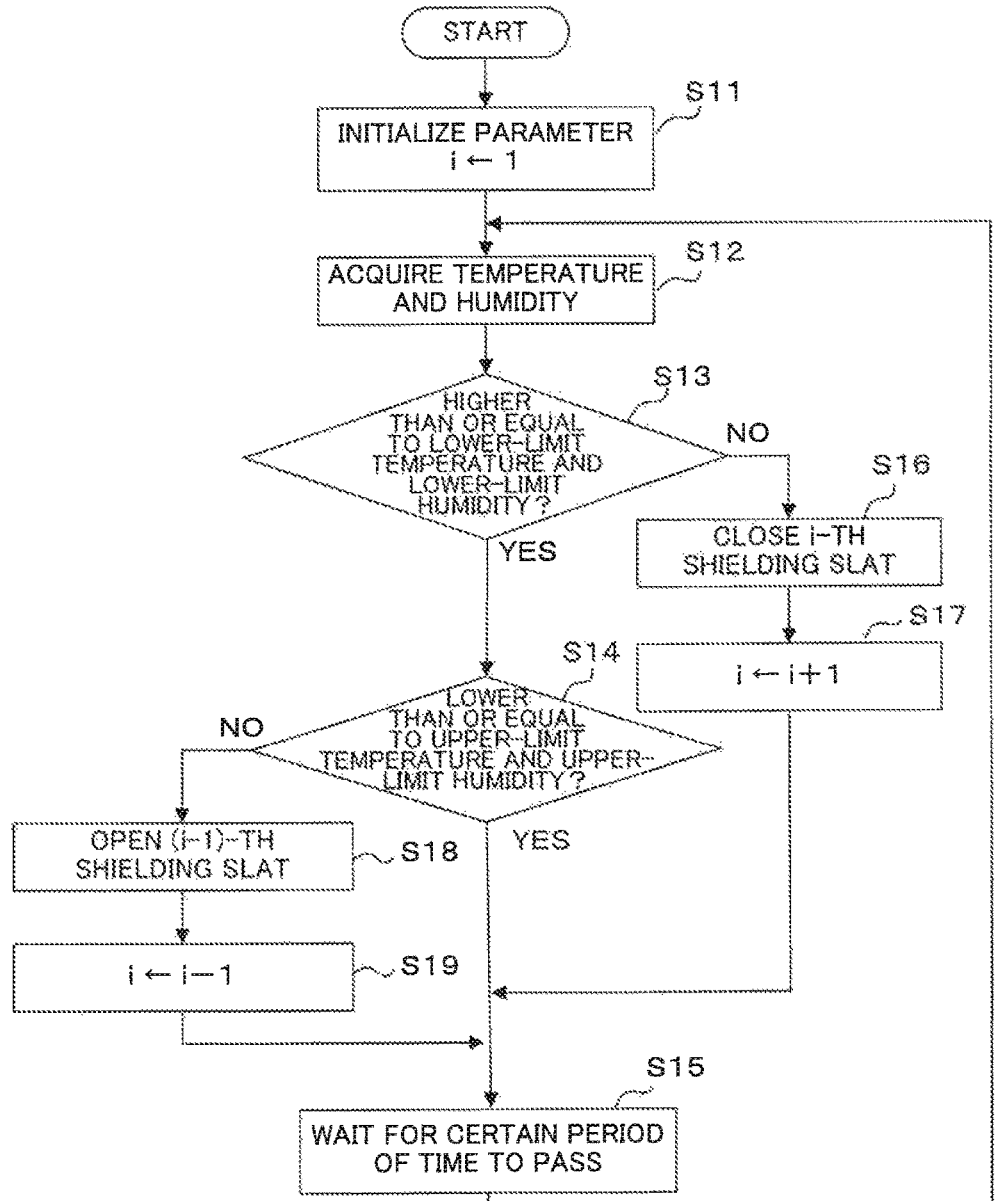
FIG. 6 is a flowchart illustrating a method of controlling the shielding-slat unit.

FIG. 6 is a flowchart illustrating how the controller 50 controls the shielding-slat unit 36. In this example, all the shielding slats 51 are closed initially as in FIG. 4B.

First, in Step S11, the controller 50 initializes a parameter i, or in other words, sets the parameter i to 1 ($i \leftarrow 1$).

Next, proceeding to Step S12, the controller 50 acquires measurement values for the temperature and humidity of air in the cold aisle 42 from the temperature sensor 45a and the humidity sensor 45b. Then, proceeding to Step S13, the controller 50 determines whether or not the temperature in the cold aisle 42 is higher than or equal to a preset lower-limit temperature and whether or not the humidity in the cold aisle 42 is higher than or equal to a preset lower-limit humidity. For example, the lower-limit temperature is 10° C., and the lower-limit humidity is 10% RH.

If it is determined in Step S13 that the temperature of the air in the cold aisle 42 is higher than or equal to the lower-limit temperature and that the humidity of the air in the cold aisle 42 is higher than or equal to the lower-limit humidity (YES), the flow proceeds to Step S14. On the other hand, if it is determined in Step S13 that the temperature of the air in the cold aisle 42 is lower than the lower-limit temperature or that the humidity of the air in the cold aisle 42 is lower than the lower-limit humidity (NO), the flow proceeds from Step S13 to Step S16.

In Step S16, the controller 50 controls the corresponding drive device 52 to close the i-th shielding slat 51 from the top. Then, the flow proceeds to Step S17 to set a value obtained by adding 1 to the value of i as a new value of i ($i \leftarrow i+1$). The flow thereafter proceeds to Step S15.

On the other hand, in a case where the flow proceeds from Step S13 to Step S14, the controller 50 determines whether or not the temperature of the air in the cold aisle 42 is lower than or equal to a preset upper-limit temperature and whether or not the humidity of the air in the cold aisle 42 is lower than or equal to a preset upper-limit humidity. For example, the upper-limit temperature is 35° C., and the upper-limit humidity is 85% RH.

If it is determined in Step S14 that the temperature of the air in the cold aisle 42 is lower than or equal to the upper-limit temperature and that the humidity of the air in the cold aisle 42 is lower than or equal to the upper-limit humidity (YES), the flow proceeds to Step S15. On the other hand, if it is determined that the temperature of the air in the cold aisle 42 exceeds the upper-limit temperature or that the humidity of the air in the cold aisle 42 exceeds the upper-limit humidity (NO), the flow proceeds from Step S14 to Step S18.

In Step S18, the controller 50 controls the corresponding drive device 52 to open the (i−1)-th shielding slat 51 from the top. Then, the flow proceeds to Step S19 to set a value obtained by subtracting 1 from the value of i as a new value of i ($i \leftarrow i-1$). The flow thereafter proceeds to Step S15.

In Step S15, the controller 50 waits for a certain period of time to pass. Then, the flow returns to Step S12 to repeat the processing described above. If the temperature of the air inside the hot aisle 43 does not fall within a desired temperature range or a desired humidity range even after opening or closing all the shielding slats 51, other processing such as operating the vaporization cooling apparatus described earlier is performed.

In this embodiment, as described above, instead of uniformly controlling the angles of all the shielding slats 51 of the shielding-slat unit 36, the opening and closing of the shielding slats 51 are controlled sequentially from the top according to temperature and humidity. Thus, the circulation amount of warm air is almost proportional to the ratio between the number of open shielding slats 51 and the number of closed shielding slats 51, and therefore the circulation amount of warm air may be precisely controlled.

(Experiment 1) By using a module-type data center having the structure illustrated in FIG. 3, the relation between the shielding ratio of the exhaust vent and the percentage of warm air circulated is examined.

The size of the container 30 is 2,331.6 mm in width, 3,474.6 mm in length, and 2,769.7 mm. in height. The size of the intake vent 31a is 1,400 mm in width and 1,570 mm in height, and the size of the exhaust vent 31b is 1,920 mm in width and 1,150 mm in height. Each of the intake vent 31a and the exhaust vent 31b is provided with a rainwater-ingress prevention plate and an insect screen.

The shielding-slat unit 36 including the shielding slats 51 made of vinyl is placed on the inner side of the exhaust vent 31b. Three racks 33 accommodating a plurality of servers 33a are installed in the container 30. The total amount of power consumed by the servers 33a is 7.2 kW, and the wind velocity of warm air exhausted from the racks 33 to the hot aisle 43 is 0.69 mm/s. In such a state, the relation between the shielding ratio of the exhaust vent 31b and the percentage of warm air circulated is examined, while the shielding-slat unit 36 changes the shielding ratio of the exhaust vent 31b (=100%−the aperture ratio).

Note that the percentage of warm, air circulated is a value obtained by dividing the amount of servers' heat circulated, by the amount of heat produced by the servers (the circulation percentage=the amount of servers ° heat circulated/the amount of heat produced by the servers). The amount of servers' heat circulated is calculated from the temperature and wind velocity of air on the intake side of the racks 33, the temperature and wind velocity of air on the exhaust side of the racks 33, and the temperature and the introduced amount of outside air. The amount of heat produced by the servers is calculated from the total amount of power consumed by the servers 33a.

Figure 7:
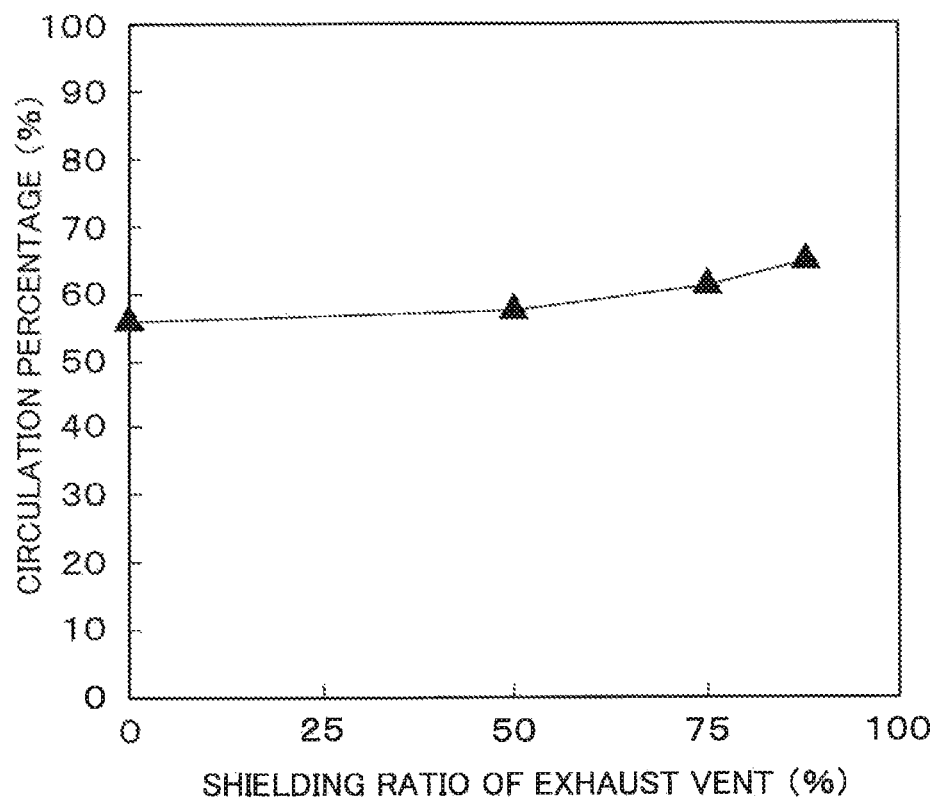
FIG. 7 is a graph depicting results of a relation between the shielding ratio of an exhaust vent and the percentage of warm air circulated.

FIG. 7 is a graph whose horizontal axis indicates the shielding ratio of the exhaust vent 31b and vertical axis indicates the percentage of warm air circulated, and depicts the results of examination on the relation between them. It is apparent from FIG. 7 that a higher shielding ratio increases the circulation percentage and thus facilitates the circulation of the warm air.

Figure 8:
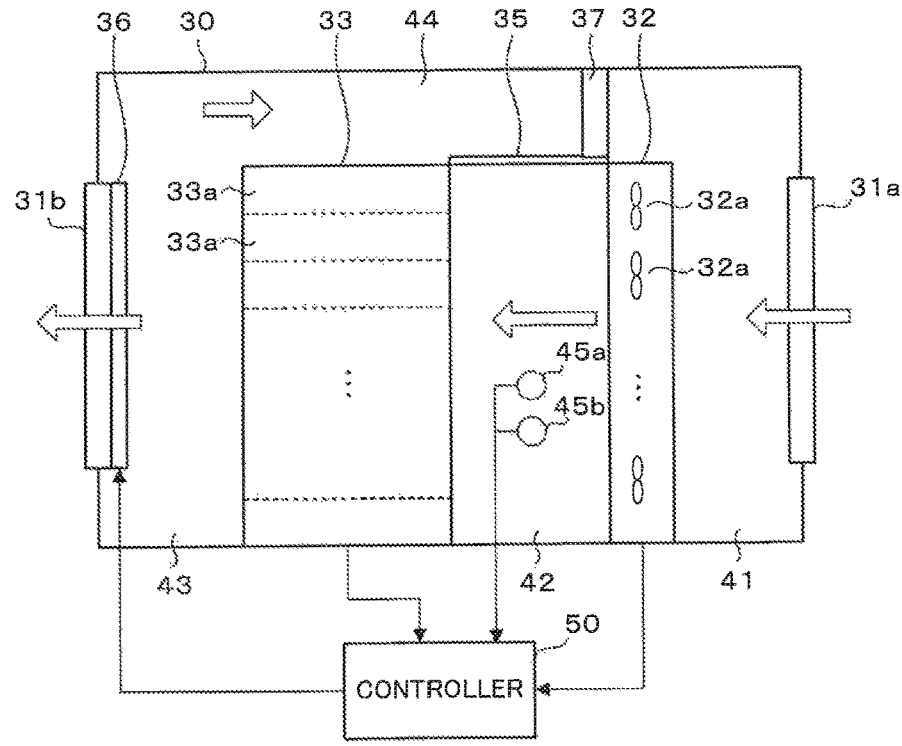
FIG. 8 is a schematic side view illustrating a module-type data center according to a second embodiment.

(Second Embodiment) FIG. 8 is a schematic side view illustrating a module-type data center according to a second embodiment. Portions in FIG. 8 that are the same as those in FIG. 3 are denoted by the same reference numerals as those used. in FIG. 3, and are not described in detail below.

In this embodiment, the controller 50 acquires not only the information on the temperature and humidity of air in the cold aisle 42, but also information on the amount of power consumed by the servers 33a in the racks 33 and information on the amount of power consumed by the fans 32a of the fan unit 32.

The controller 50 calculates the amount of heat produced by the servers 33a and the rotation speed of the fans 32a from the information on the amount of power consumed by the servers 33a and the amount of power consumed by the fans 32a. Then, based on the calculation results, the controller 50 determines which one(s) of the shielding slats 51 of the shielding-slat unit 36 (see FIGS. 4A to 4C) will be open and which one(s) of them will be closed, so that the temperature and humidity of the air in the cold aisle 42 may fall within a desired range. Based on the determination, the controller 50 controls the drive devices 52 of the shielding-slat unit 36 to open or close the certain one(s) of the shielding slats 51.

As described above, in this embodiment, the shielding slats 51 to be open and the shielding slats 51 to be closed are determined based on the amount of power consumed by the servers 33a accommodated in the racks 33 and the rotation speed of the fans 32a of the fan unit 32. This allows speedy control of the shielding-slat unit 36 according to a change in the amount of heat discharged from the racks 33, to promptly change the aperture ratio of the exhaust vent 31b.

Figure 9:
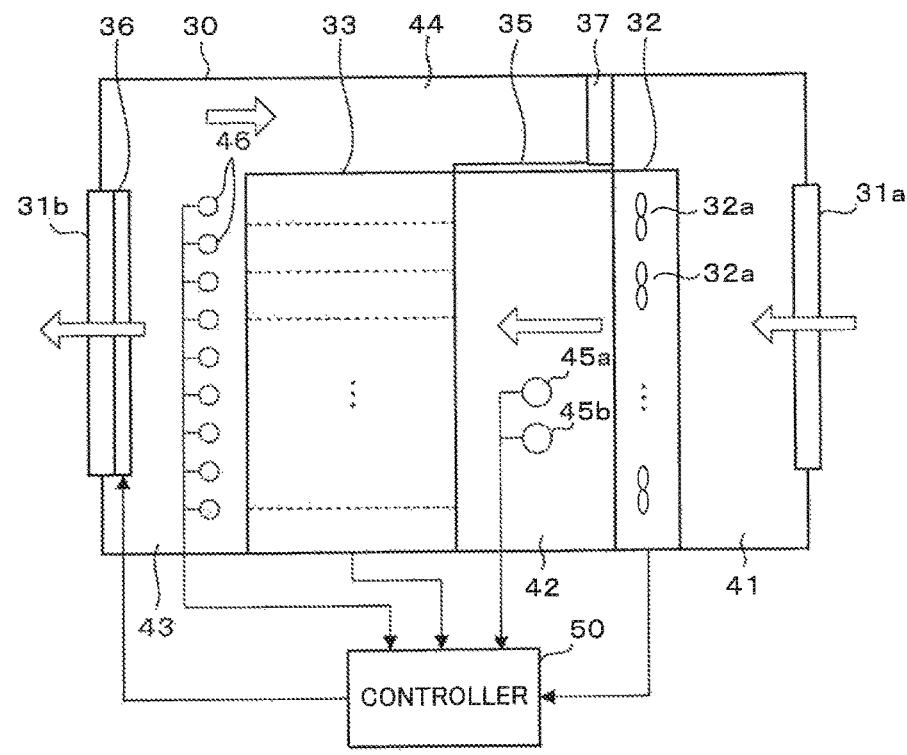
FIG. 9 is a schematic side view illustrating a module-type data center according to a third embodiment.

(Third Embodiment) FIG. 9 is a schematic side view illustrating a module-type data center according to a third embodiment. Portions in FIG. 9 that are the same as those in FIG. 8 are denoted by the same reference numerals as those used in FIG. 8, and are not described in detail below.

In some cases, wind-velocity distribution on the exhaust surface side of the racks 33 is inhomogeneous due to factors such as the operating status of the fans 32a of the fan unit 32, the servers 33a installed in the racks 33, or an obstacle in the container 30. In such a case, the wind volume and the circulation amount are preferably controlled in further consideration of the wind-velocity distribution. To this end, in this embodiment, a plurality of wind-velocity sensors 46 are placed in the hot aisle 43 to measure the wind-velocity distribution of warm air exhausted from the racks 33. The plurality of wind-velocity sensors 46 is an example of a wind-velocity distribution detector.

Among the shielding slats 51 of the shielding-slat unit 36 (see FIGS. 4A to 4C), the controller 50 preferentially closes the shielding slat 51 that is located at a Position with a high wind velocity. This allows a large amount of warm air to be circulated with a low shielding ratio, and the power consumed by the fan unit 32 may be reduced by the reduced pressure resistance.

Figure 10:
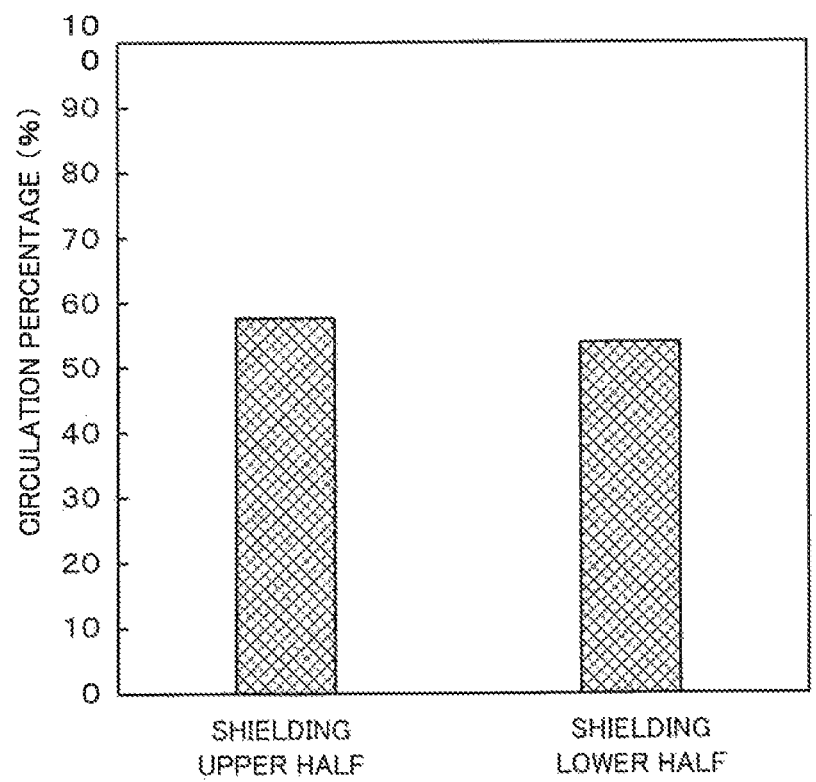
FIG. 10 is a graph depicting a circulation percentage obtained when shielding slats corresponding to the upper half of the exhaust vent were closed and shielding slats corresponding to the lower half were opened, and a circulation percentage obtained when the shielding slats corresponding to the upper half of the exhaust vent were opened and the shielding slats corresponding to the lower half were closed.

(Experiment 2) A module-type data center similar to the one used in Experiment 1 is used. The wind velocity at the upper half of the exhaust vent 31b is 1.01 m/sec, and the wind velocity at the lower half thereof was 0.86 m/sec. Then, the circulation percentage is measured with the shielding slats 51 corresponding to the upper half of the exhaust vent 31b being closed and the shielding slats 51 corresponding to the lower half thereof being opened. In addition, the circulation percentage is measured with the shielding slats 51 corresponding to the upper half of the exhaust vent 31b being opened and the shielding slats 51 corresponding to the lower half thereof being closed. FIG. 10 depicts results of those measurements.

As depicted in FIG. 10, the circulation percentage is 58.1% when the shielding slats 51 corresponding to the upper half of the exhaust vent 31b are closed (shielded) and the shielding slats 51 corresponding to the lower half thereof are opened. On the other hand, the circulation percentage is 53.1% when the shielding slats 51 corresponding to the upper half of the exhaust vent 31b are opened and, the shielding slats 51 corresponding to the lower half thereof are closed (shielded).

It is apparent from FIG. 10 that even with the same aperture ratio of the exhaust vent 31b, a higher circulation percentage may be obtained by preferentially closing the shielding slats 51 corresponding to a portion with a high wind velocity than by preferentially closing the shielding slats 51 corresponding to a portion with a low wind velocity.

Figure 11:
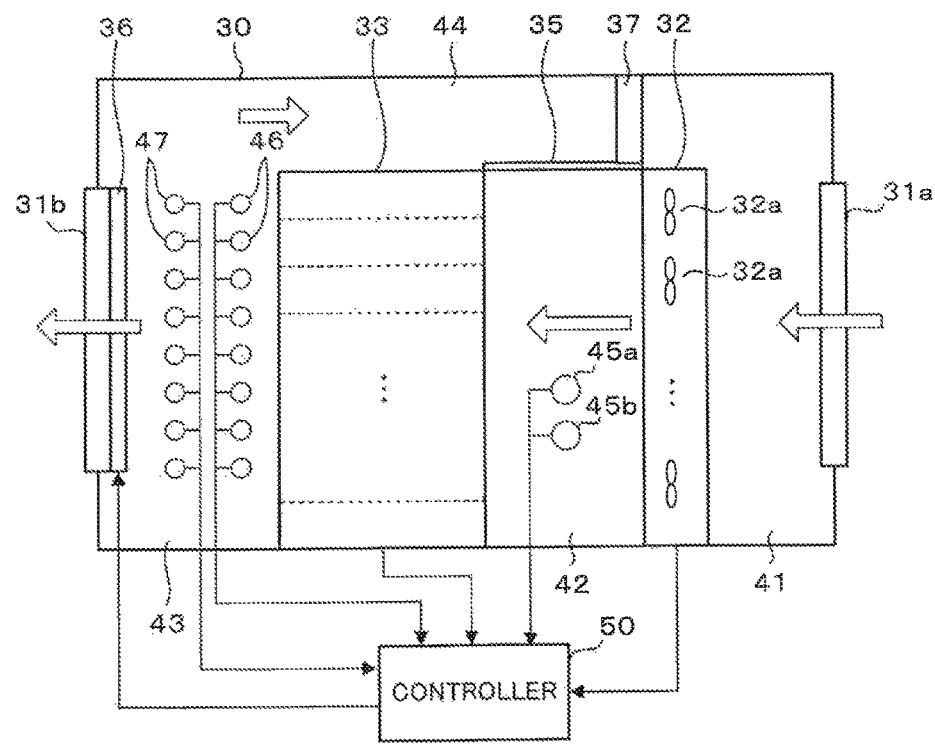
FIG. 11 is a schematic side view illustrating a module-type data center according to a fourth embodiment.

(Fourth Embodiment) FIG. 11 is a schematic side view illustrating a module-type data center according to a fourth embodiment. Portions in FIG. 11 that are the same as those in FIG. 9 are denoted by the same reference numerals as those used in FIG. 9, and are not described in detail below.

When temperature distribution or humidity distribution in the hot aisle 43 is inhomogeneous due to such reasons as different operation statuses of the servers 33a, it is preferable to control the shielding-slat unit 36 in further consideration of temperature distribution or humidity distribution. To this end, in this embodiment, a plurality of temperature-humidity sensors 47 are placed in the hot aisle 43 in addition to the plurality of wind-velocity sensors 46, to measure the wind-velocity distribution, temperature distribution, and humidity distribution of warm air exhausted from the racks 33. The plurality of temperature-humidity sensors 47 are an example of a temperature distribution detector and an example of a humidity distribution detector.

Among the shielding slats 51 of the shielding-slat unit 36 (see FIGS. 4A to 4C), the controller 50 preferentially closes the shielding slat 51 that is located at a position with a high wind velocity, a high temperature, or a high humidity.

Figure 12:
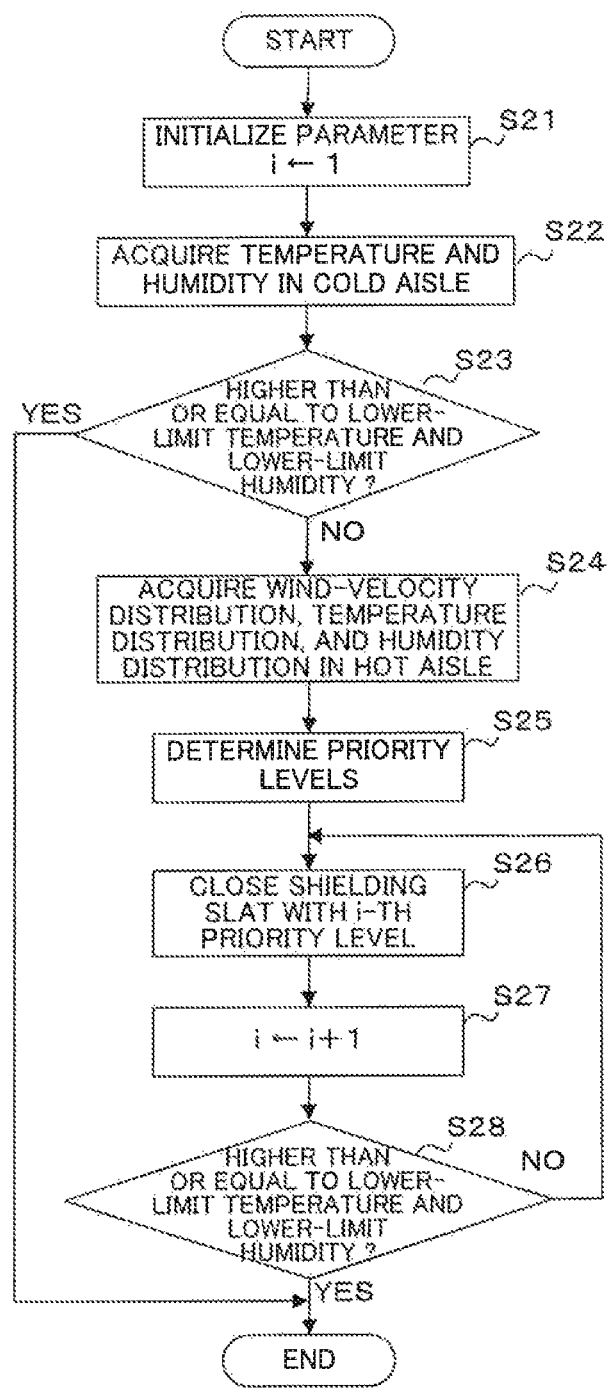
FIG. 12 is a flowchart illustrating a method of controlling the shielding-slat unit.

FIG. 12 is a flowchart illustrating how the controller 50 controls the shielding-slat unit 36. In this example, all the shielding slats 51 are opened initially as in FIG. 4B. Note that it is assumed herein, for simplification of illustration, that the temperature and humidity in the cold aisle 42 do not exceed their upper-limit values.

First, in Step S21, the controller 50 initializes the parameter i, or in other words, sets the parameter i to 1 (i←1).

Next, in Step S22, the controller 50 acquires measurement values for the temperature and humidity of air in the cold, aisle 42 from the temperature sensor 45a and the humidity sensor 45b. Then, proceeding to Step S23, the controller 50 determines whether or not the temperature in the cold aisle 42 is higher than or equal to a preset lower-limit temperature and whether or not the humidity in the cold aisle 42 is higher than or equal to a preset lower-limit humidity.

If it is determined in Step S23 that the temperature of the air in the cold aisle 42 is higher than or equal to the lower-limit temperature and that the humidity of the air in the cold aisle 42 is higher than or equal to the lower-limit humidity (YES), the shielding-slat unit 36 does not have to be controlled, and therefore the processing ends.

On the other hand, if it is determined in Step S23 that the temperature of the air in the cold aisle 42 is lower than the lower-limit temperature or that the humidity of the air in the cold aisle 42 is lower than the lower-limit humidity (NO), the flow proceeds from Step S23 to Step S24.

In Step S24, the controller 50 acquires the wind-velocity distribution, the temperature distribution, and the humidity distribution in the hot aisle 43 from the wind-velocity sensors 46 and the temperature-humidity sensors 47. Then, proceeding to Step S25, the controller 50 determines the priority levels of the respective shielding slats of the shielding-slat unit 36 based on the wind-velocity distribution, the temperature distribution, and the humidity distribution acquired in Step S24. For instance, a higher priority level is given to the shielding slat 51 with a higher value of aV+bT+cM (where V indicates velocity, T temperature, and M humidity, and a, b, and c are all constants).

Next, proceeding to Step S26, the controller 50 closes the shielding slat 51 with the i-th priority level. Thereafter, proceeding to Step S27, the controller 50 sets a value obtained by adding 1 to the value of i as a new value of i (i←i+1).

Next, proceeding to Step S28, the controller 50 determines whether or not the temperature in the cold aisle 42 is higher than or equal to the preset lower-limit temperature and whether or not the humidity in the cold aisle 42 is higher than or equal to the preset lower-limit humidity. If the determination result in Step 328 is NO, the flow returns to Step S26 to close the next shielding slat 51.

In this way, the controller 50 closes the shielding slats 51 sequentially from the one with the highest priority level until the determination result in Step S28 turns out to be YES. The processing described above is performed repeatedly at certain time intervals.

(Experiment 3) A module-type data center similar to the one used in Experiment 1 is used. The amount of heat produced by the servers in the upper side of the racks 33 is 12 kW, and the amount of heat produced by the servers in the lower side thereof is 3.5 kW. Then, the circulation percentage is measured with the shielding slats 51 corresponding to the upper half of the exhaust vent 31*b* being closed and the shielding slats 51 corresponding to the lower half thereof being opened. In addition, the circulation percentage is measured with the shielding slats 51 corresponding to the upper half of the exhaust vent 31*b* being opened and the shielding slats 51 corresponding to the lower half thereof being closed.

As a result, the circulation percentage is 57.9% when the shielding slats 51 corresponding to the upper half of the exhaust vent 31*b* are closed and the shielding slats 51 corresponding to the lower half thereof are opened, and the circulation percentage is 56.1% when the shielding slats 51 corresponding to the upper half of the exhaust vent 31*b* are opened and the shielding slats 51 corresponding to the lower half thereof are closed.

It is apparent from these results that even with the same aperture ratio of the exhaust vent 31*b,* a higher circulation percentage may be obtained by preferentially closing the shielding slats 51 corresponding to a portion with a high temperature than by preferentially closing the shielding slats 51 corresponding to a portion with a low temperature.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A module-type data center comprising:
a casing having an intake vent on one of surfaces of the casing and an exhaust vent on another one of the surfaces of the casing;
a rack placed inside the casing and accommodating an electronic device;
an air blower placed between an intake vent and the one surface of the rack to introduce outside air into the casing through the intake vent and pass air through the rack from one of surfaces of the rack to another one of the surfaces of the rack;
a shielding-slat unit placed on an inner side of the exhaust vent, and including a plurality of shielding slats configured to change between an open state and a closed state per the exhaust vent and drive devices configured to drive the corresponding shielding slats, the shielding-slat unit to change an aperture ratio of the exhaust vent by varying a ratio between a number of the shielding slats in the open state and a number of the shielding slats in the closed state of the plurality of shielding slats;
a controller configured to control the drive devices of the shielding-slat unit to change the aperture ratio of the exhaust vent, or to maintain the aperture ratio of the exhaust vent for a preset time when a temperature measured by the temperature sensor is lower than a preset temperature, until the measured temperature becomes greater than the preset temperature, wherein an inner space of the casing is divided into a first space defined between the one surface of the rack and the intake vent, a second space defined between the other surface of the rack and the exhaust vent, and a third space defined above the rack and allowing the second space to communicate with the first space; and
a temperature sensor placed inside the first space,
wherein the controller controls the drive devices of the shielding-slat unit based on a signal outputted from the temperature sensor,
wherein when a temperature measured by the temperature sensor is lower than a preset temperature, the controller sequentially closes the shielding slats of the shielding-slat unit until the temperature measured by the temperature sensor reaches or exceeds the preset temperature, and
wherein the controller acquires information on an amount of power consumed by the air blower and information on an amount of power consumed by the electronic device placed in the rack, and based on the information on the amount of power consumed by the air blower and the information on the amount of power consumed by the electronic device placed in the rack, determines an order of the closing of the shielding slats performed when the temperature measured by the temperature sensor is lower than the preset temperature.

2. A module-type data center comprising:
a casing having an intake vent on one of surfaces of the casing and an exhaust vent on another one of the surfaces of the casing;
a rack placed inside the casing and accommodating an electronic device;
an air blower placed between an intake vent and the one surface of the rack to introduce outside air into the casing through the intake vent and pass air through the rack from one of surfaces of the rack to another one of the surfaces of the rack;

a shielding-slat unit placed on an inner side of the exhaust vent, and including a plurality of shielding slats configured to change between an open state and a closed state per the exhaust vent and drive devices configured to drive the corresponding shielding slats, the shielding-slat unit to change an aperture ratio of the exhaust vent by varying a ratio between a number of the shielding slats in the open state and a number of the shielding slats in the closed state of the plurality of shielding slats;

a controller configured to control the drive devices of the shielding-slat unit to change the aperture ratio of the exhaust vent, or to maintain the aperture ratio of the exhaust vent for a preset time when a temperature measured by the temperature sensor is lower than a preset temperature, until the measured temperature becomes greater than the preset temperature, wherein an inner space of the casing is divided into a first space defined between the one surface of the rack and the intake vent, a second space defined between the other surface of the rack and the exhaust vent, and a third space defined above the rack and allowing the second space to communicate with the first space;

a temperature sensor placed inside the first space, wherein the controller controls the drive devices of the shielding-slat unit based on a signal outputted from the temperature sensor, wherein when a temperature measured by the temperature sensor is lower than a preset temperature, the controller sequentially closes the shielding slats of the shielding-slat unit until the temperature measured by the temperature sensor reaches or exceeds the preset temperature; and a wind-velocity distribution detector configured to measure wind-velocity distribution in the second space, wherein when the temperature measured by the temperature sensor is lower than the preset temperature, the controller closes the shielding slats sequentially from one at a position with a high wind velocity.

3. A module-type data center comprising:

a casing having an intake vent on one of surfaces of the casing and an exhaust vent on another one of the surfaces of the casing;

a rack placed inside the casing and accommodating an electronic device;

an air blower placed between an intake vent and the one surface of the rack to introduce outside air into the casing through the intake vent and pass air through the rack from one of surfaces of the rack to another one of the surfaces of the rack;

a shielding-slat unit placed on an inner side of the exhaust vent, and including a plurality of shielding slats configured to change between an open state and a closed state per the exhaust vent and drive devices configured to drive the corresponding shielding slats, the shielding-slat unit to change an aperture ratio of the exhaust vent by varying a ratio between a number of the shielding slats in the open state and a number of the shielding slats in the closed state of the plurality of shielding slats;

a controller configured to control the drive devices of the shielding-slat unit to change the aperture ratio of the exhaust vent, or to maintain the aperture ratio of the exhaust vent for a preset time when a temperature measured by the temperature sensor is lower than a preset temperature, until the measured temperature becomes greater than the preset temperature, wherein an inner space of the casing is divided into a first space defined between the one surface of the rack and the intake vent, a second space defined between the other surface of the rack and the exhaust vent, and a third space defined above the rack and allowing the second space to communicate with the first space;

a temperature sensor placed inside the first space, wherein the controller controls the drive devices of the shielding-slat unit based on a signal outputted from the temperature sensor, wherein when a temperature measured by the temperature sensor is lower than a preset temperature, the controller sequentially closes the shielding slats of the shielding-slat unit until the temperature measured by the temperature sensor reaches or exceeds the preset temperature;

a wind-velocity distribution detector configured to measure wind-velocity distribution in the second space;

a temperature distribution detector configured to measure temperature distribution in the second space; and a humidity distribution detector configured to measure humidity distribution in the second space, wherein based on signals outputted from the wind-velocity distribution detector, the temperature distribution detector, and the humidity distribution detector, the controller determines an order of the closing of the shielding slats performed when the temperature measured by the temperature sensor is lower than the preset temperature.

* * * * *